United States Patent
Oh et al.

(10) Patent No.: US 8,278,218 B2
(45) Date of Patent: Oct. 2, 2012

(54) ELECTRICAL CONDUCTOR LINE HAVING A MULTILAYER DIFFUSION BARRIER FOR USE IN A SEMICONDUCTOR DEVICE AND METHOD FOR FORMING THE SAME

(75) Inventors: Joon Seok Oh, Gyeonggi-do (KR); Seung Jin Yeom, Gyeonggi-do (KR); Baek Mann Kim, Gyeonggi-do (KR); Dong Ha Jung, Gyeonggi-do (KR); Jeong Tae Kim, Gyeonggi-do (KR); Nam Yeal Lee, Gyeonggi-do (KR); Jae Hong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/241,415

(22) Filed: Sep. 23, 2011

(65) Prior Publication Data

US 2012/0015516 A1    Jan. 19, 2012

Related U.S. Application Data

(62) Division of application No. 12/469,883, filed on May 21, 2009, now abandoned.

(30) Foreign Application Priority Data

Jul. 25, 2008    (KR) .................. 10-2008-0073170

(51) Int. Cl.
*H01L 21/44*    (2006.01)

(52) U.S. Cl. ........ 438/685; 257/741; 257/750; 257/761; 257/763; 257/764; 257/770; 257/751; 438/648; 438/656; 438/761

(58) Field of Classification Search .................. 257/741, 257/750, 751, 761, 763, 764, 770; 438/648, 438/656, 685, 761
See application file for complete search history.

(56) References Cited

U.S. PATENT DOCUMENTS

| 2004/0046500 | A1* | 3/2004 | Stegamat ...................... 313/512 |
| 2005/0212139 | A1 | 9/2005 | Leinikka et al. |
| 2008/0251780 | A1 | 10/2008 | Li et al. |

(Continued)

FOREIGN PATENT DOCUMENTS

JP    2000-174121 A    6/2000

(Continued)

OTHER PUBLICATIONS

USPTO OA mailed Mar. 21, 2011 in connection with U.S. Appl. No. 12/469,883.

(Continued)

*Primary Examiner* — Jae Lee
(74) *Attorney, Agent, or Firm* — Ladas & Parry LLP

(57) ABSTRACT

An electrical conductor having a multilayer diffusion barrier of use in a resultant semiconductor device is presented. The electrical conductor line includes an insulation layer, a diffusion barrier, and a metal line. The insulation layer is formed on a semiconductor substrate and having a metal line forming region. The diffusion barrier is formed on a surface of the metal line forming region of the insulation layer and has a multi-layered structure made of TaN layer, an $Mo_xO_y$ layer and an Mo layer. The metal line is formed on the diffusion barrier to fill the metal line forming region of the insulation layer.

14 Claims, 5 Drawing Sheets

U.S. PATENT DOCUMENTS

2009/0014878 A1* 1/2009 Cabral et al. .................. 257/751
2009/0278232 A1* 11/2009 Vaartstra et al. .............. 257/532

FOREIGN PATENT DOCUMENTS

| KR | 1020020055315 A | 7/2002 |
| KR | 1020030020469 A | 3/2003 |
| KR | 0712168 A | 4/2007 |
| KR | 100761467 B1 | 9/2007 |
| KR | 1020080068509 A | 7/2008 |
| KR | 0856023 A | 9/2008 |
| KR | 0920038 A | 10/2009 |

OTHER PUBLICATIONS

USPTO OA mailed Jun. 23, 2011 in connection with U.S. Appl. No. 12/469,883.

* cited by examiner

ELECTRICAL CONDUCTOR LINE HAVING A MULTILAYER DIFFUSION BARRIER FOR USE IN A SEMICONDUCTOR DEVICE AND METHOD FOR FORMING THE SAME

CROSS-REFERENCE TO RELATED APPLICATIONS

The present application claims priority to Korean patent application number 10-2008-0073170 filed on Jul. 25, 2008, which is incorporated herein by reference in its entirety.

BACKGROUND OF THE INVENTION

The present invention relates to a metal line of a semiconductor device and a method for forming the same, and more particularly, to a metal line of a semiconductor device that exhibits improved physical and performance characteristics which is results in improving the reliability of a resultant semiconductor device and a method for forming the same.

Generally, in a semiconductor device, metal lines are formed to electrically connect elements or lines to each other. Contact plugs are formed to connect lower metal lines and upper metal lines to each other. As the high integration of a semiconductor device continues to proceed, the design rules necessarily result in gradually increasing the aspect ratios of a contact hole in which a contact plug is to be formed. As a result, the process for forming metal lines and contact plugs become more difficult because these diminutive metal lines and contact plugs must also maintain their physical and performance characteristics such as assuring that unwanted impurities do not diffuse past certain barriers.

Aluminum and tungsten have been mainly used as conductive materials in the metal lines of a semiconductor device because they exhibit relatively good electrical conductivity properties and because they do not tend towards adversely affecting the performance of the resultant semiconductor device due to unwanted diffusion away from these metal lines. Recently, research has been made in the hopes of using copper as a next-generation material for a metal line because copper exhibits superior electrical conductivity and low resistance as compared to aluminum and tungsten. Copper (Cu) can therefore solve or at least aid in minimizing the problems associated with RC (resistance-capacitance) signal delay in the semiconductor device having a high level of integration and high operating speed.

It is known that copper diffuses very fast through semiconductor substrates and through insulation layers. Further the diffused copper is known to act as a deep-level impurity in the semiconductor substrate made of silicon and can induce leakage currents. Therefore, it is necessary to form a diffusion barrier at an interface between a copper layer acting as a metal line and the surrounding insulation layer. Generally, the diffusion barrier made of TaN/Ta layers is able to restrain copper from diffusing beyond the confines of the metal line.

Hereinbelow, a conventional method for forming a metal line of a semiconductor device will be briefly described.

After forming an insulation layer on a semiconductor substrate designated to have a metal line forming region, TaN/Ta layers serving as a diffusion barrier and a copper seed layer are sequentially formed on the surface of the insulation layer. The Ta layer functions to increase the adhesion force between the diffusion barrier and the copper seed layer. Then, after forming a copper layer on the copper seed layer, by using CMPing (chemically and mechanically polishing) on the copper layer, a copper metal line is formed.

However, in the conventional art described above, it is necessary to form a thick Ta layer so as to increase the adhesion force between the diffusion barrier and the copper seed layer. Due to this fact, in the conventional art described above, the thickness of the diffusion barrier increases, and the thickness of the copper layer necessarily decreases because of the geometric constraints of the diminutive structure, whereby the characteristics of the copper metal line deteriorates.

Also, in the conventional art described above, in order to reduce the agglomeration of copper, the copper seed layer should be formed through PVD (physical vapor deposition) at a low temperature. Due to this fact, in the conventional art described above, the step coverage of the copper seed layer becomes poor, which leads to the formation of unwanted overhangs. As a consequence, the entrance to the metal line forming region is likely to be clogged which in turn results in forming voids along and within the metal line.

These problems are getting worse as the design rule of a semiconductor device gradually decreases and as a result the characteristics and the reliability of the resultant semiconductor devices can deteriorate.

BRIEF SUMMARY OF THE INVENTION

Embodiments of the present invention are directed to a metal line of a semiconductor device which can improve the characteristics of a metal line and a method for forming the same.

Embodiments of the present invention are also directed to metal lines of a resultant semiconductor device that can prevent or at least minimize the occurrence of voids from being created in a metal line and are directed to methods for forming the same.

Further embodiments of the present invention are directed to metal lines of a semiconductor device that exhibit improved the characteristics and reliability in the resultant semiconductor devices and are directed to methods for forming the same.

In one aspect of the present invention, a metal line of a semiconductor device comprises an insulation layer formed on a semiconductor substrate and having a metal line forming region; a diffusion barrier formed on a surface of the metal line forming region of the insulation layer and having a multi-layered structure of a TaN layer, an $Mo_xO_y$ layer and an Mo layer; and a metal line formed on the diffusion barrier to fill the metal line forming region of the insulation layer.

The TaN layer has a thickness of about 5~50 Å.

The $Mo_xO_y$ layer has a thickness of about 5~50 Å.

In the $Mo_xO_y$ layer, x has a range of about 0.1~5 and y has a range of about 0.1~5.

The Mo layer has a thickness of about 100~400 Å.

The metal layer comprises a copper layer.

In another aspect of the present invention, a method for forming a metal line of a semiconductor device comprises the steps of forming an insulation layer on a semiconductor substrate to have a metal line forming region; forming a diffusion barrier on the insulation layer including a surface of the metal line forming region to have a multi-layered structure of a TaN layer, an $Mo_xO_y$ layer and an Mo layer; and forming a metal line on the diffusion barrier to fill the metal line forming region.

The step of forming the diffusion barrier comprises the steps of forming a TaN layer on the insulation layer including a surface of the metal line forming region; depositing a first Mo layer on the TaN layer; forming an $Mo_xO_y$ layer by oxidating the first Mo layer; and depositing a second Mo layer on the $Mo_xO_y$ layer and thereby forming a multi-layered structure of the TaN layer, the $Mo_xO_y$ layer and an Mo layer.

The TaN layer is formed to have a thickness of about 5~50 Å.

The first Mo layer is formed to have a thickness of about 5~25 Å.

The step of forming the $Mo_xO_y$ layer by oxidating the first Mo layer is implemented by using either a $O_2$ plasma process or a $O_2$ stuffing procedure.

The $O_2$ plasma process uses an $O_2$ and Ar gases having a composition ratio of the $O_2$ to Ar gas at about 0.1~0.9.

The $O_2$ plasma process is conducted at a temperature of about 25~250° C.

The $O_2$ plasma processing is conducted under a pressure of about 1~760 mTorr.

The $O_2$ stuffing procedure also uses $O_2$ and Ar gas, and also uses a $O_2$ to Ar composition ratio of about 0.1~0.9.

The $O_2$ stuffing procedure is conducted at a temperature of about 50~400° C.

The $O_2$ stuffing is conducted under a pressure of about 1~760 mTorr

The $Mo_xO_y$ layer is formed to have a thickness of about 5~50 Å.

In the $Mo_xO_y$ layer, x has a range of about 0.1~5 and y has a range of about 0.1~5.

The second Mo layer is deposited using PVD.

The second Mo layer is deposited at a temperature of about −25~25° C.

The second Mo layer is deposited to a thickness of about 100~400 Å.

The metal layer comprises a copper layer.

DESCRIPTION OF SPECIFIC EMBODIMENTS

Hereafter, specific embodiments of the present invention will be described in detail with reference to the attached drawings.

Figure 1:
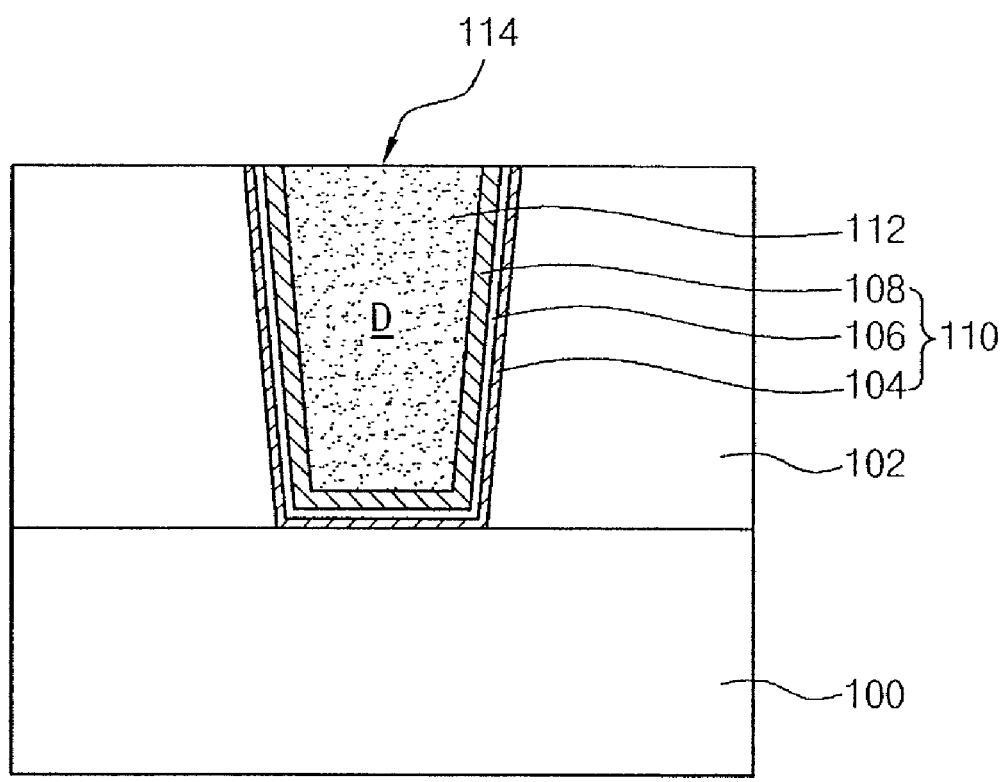
FIG. 1 is a sectional view illustrating a metal line of a semiconductor device in accordance with an embodiment of the present invention.

FIG. 1 is a sectional view illustrating a metal line of a semiconductor device in accordance with an embodiment of the present invention.

Referring to FIG. 1, an insulation layer 102 is formed on a semiconductor substrate 100 which is formed with a predetermined understructure (not shown), to have a metal line forming region D. The metal line forming region D can be defined by using a single damascene process or a dual damascene process to have a trench structure or a trench and via-hole structure which has a trench and at least one via-hole communicating with the trench. While not shown in a drawing, it is conceivable that the insulation layer 102 can comprise the stack structure of first and second insulation layers. In this case, an etch stop layer is formed between the first and second insulation layers. The etch stop layer comprises, for example, an SiN layer.

A diffusion barrier 110 is formed on the surface of the metal line forming region D which is defined in the insulation layer 102. The diffusion barrier 110 is shown having a multi-layered structure that includes a TaN layer 104, an $Mo_xO_y$ layer 106 and a second Mo layer 108. In the diffusion barrier 110, the TaN layer 104 may have any thickness, preferably having a thickness of about 5~50 Å; the $Mo_xO_y$ layer 106 may have any thickness, preferably having a thickness of about 5~50 Å; and the second Mo layer 108 may have any thickness, preferably having a thickness of about 100~400 Å. In the $Mo_xO_y$ layer 106 the stoichiometric ratios may be any relative ratios, in which the x subscript may preferably exist in a range of about 0.1~5 and the y subscript may preferably exist in a range of about 0.1~5.

A metal line 114 formed on the diffusion barrier 110 substantially fills in the metal line forming region D. The metal line 114 may be composed of any conductive material or metal, in which the metal line 114 preferably comprises a copper layer 112.

As described above, the metal line 114 according to the embodiment, the present invention has the diffusion barrier 110 which is formed between the copper layer 112 and the insulation layer 102 and is composed of a multi-layered structure that comprises a TaN layer 104, a $Mo_xO_y$ layer 106 and a second Mo layer 108. The second Mo layer 108 has low solid solubility with respect to other metal elements and therefore ensures in establishing and maintaining excellent characteristics of the resultant diffusion barrier 110. According to this fact, in the present invention, due to the presence of the diffusion barrier 110 which is structured to include the second Mo layer 108, it is possible to prevent or at least minimize the occurrence that the constituent of the copper layer 112 is inhibited from diffusing outside of the confines of the diffusion barrier 110.

Also, in the present invention, due to the presence of the $Mo_xO_y$ layer 106 which is formed through the oxidation of a first Mo layer, the density at the peripheral portions of grains which serve as diffusion paths can be increased, whereby the characteristics of the diffusion barrier 110 can be further effectively enhanced.

Further, in the present invention, since the diffusion barrier 110 has a multi-layered structure comprising the $Mo_xO_y$ layer 106 and the second Mo layer 108, the characteristics of the diffusion barrier 110 can be improved even though the thickness of the TaN layer 104 can be half that in comparison with the conventional art. Accordingly, in the present invention, the characteristics and the reliability of the resultant semiconductor device can be substantially improved.

Moreover, in the present invention, the diffusion barrier 110 includes the second Mo layer 108 that exhibits a relatively low resistance. Through this fact, in the present invention, the second Mo layer 108 can serve not only as the diffusion barrier 110 but also can serve as the seed layer of the copper layer 112. Accordingly, in the present invention, since the copper layer 112 can be deposited without a copper seed layer, then it is possible to prevent or at least minimize the occurrence of forming voids in the metal line 114 because the overhang phenomenon of the copper seed layer does not exist in the present invention.

In addition, in the present invention, since the diffusion barrier 110 includes the TaN layer 104 and that the TaN layer 104 contacts the insulation layer 102, then the junction capability between the TaN layer 104 and the insulation layer 102 can be improved or enhanced.

FIGS. 2A through 2G depict sectional views that illustrate some of the processes of a method for forming a metal line of a semiconductor device in accordance with another embodiment of the present invention.

Figure 2A:
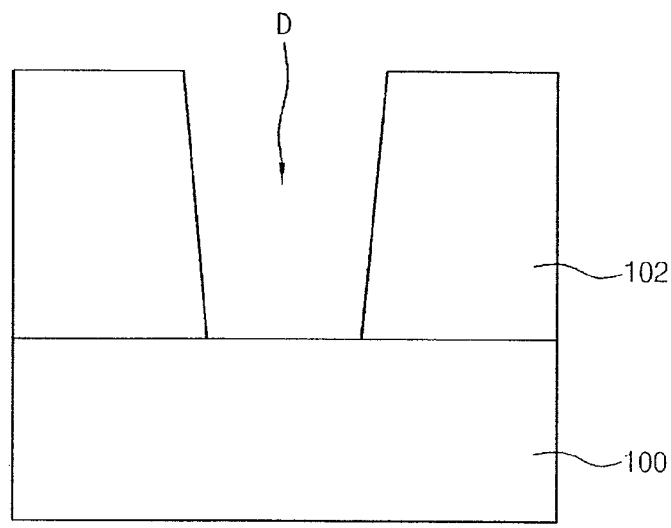
FIGS. 2A through 2G are sectional views illustrating the processes of a method for forming a metal line of a semiconductor device in accordance with another embodiment of the present invention.

Referring to FIG. 2A, an insulation layer 102 is formed on a semiconductor substrate 100 which is formed with a predetermined understructure (not shown), in such a way as to cover the understructure. While not shown in a drawing, it is understood that the insulation layer 102 can be composed of a single or a plurality of layers such as comprising a stack structure of first and second insulation layers. In the case of a stack like structure of the insulation layer 102, it is preferred that an etch stop layer be formed between the first and second insulation layers. The etch stop layer may comprise any etch stop layer, preferably an is SiN layer.

Next, a metal line forming region D is defined by etching into the insulation layer 102. The metal line forming region D can be defined by using any metal line forming technique such as using a single damascene process or even a dual damascene process in such a way as to have a trench structure or a trench and via-hole structure which has a trench and at least one via-hole communicating with the trench.

Figure 2B:
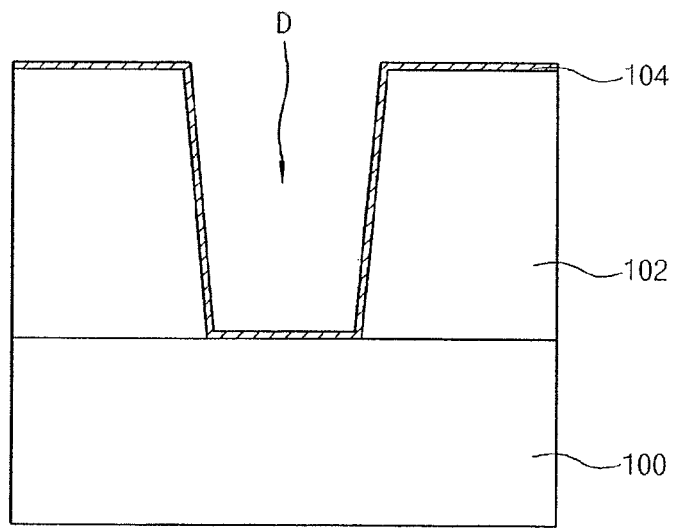

Referring to FIG. 2B, a TaN layer 104 is then formed on the insulation layer 102 and on the surface of the metal line forming region D. The TaN layer 104 is formed using any well known deposition technique such as using CVD (chemical vapor deposition) or PVD (physical vapor deposition). The thickness of the TaN layer 104 may have any thickness in which it is preferable that the thickness is about 5~50 Å.

Figure 2C:
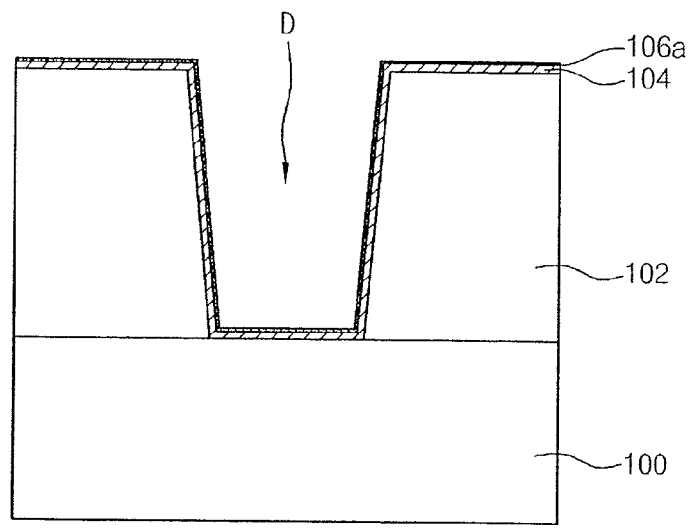

Referring to FIG. 2C, a first Mo layer 106a is subsequently formed on the TaN layer 104. The first Mo layer 106a is formed using any well known deposition technique such as using CVD or PVD. The thickness of the first Mo layer 106a may made at any thickness in which it is preferable that the thickness is preferably about 5~25 Å.

Figure 2D:
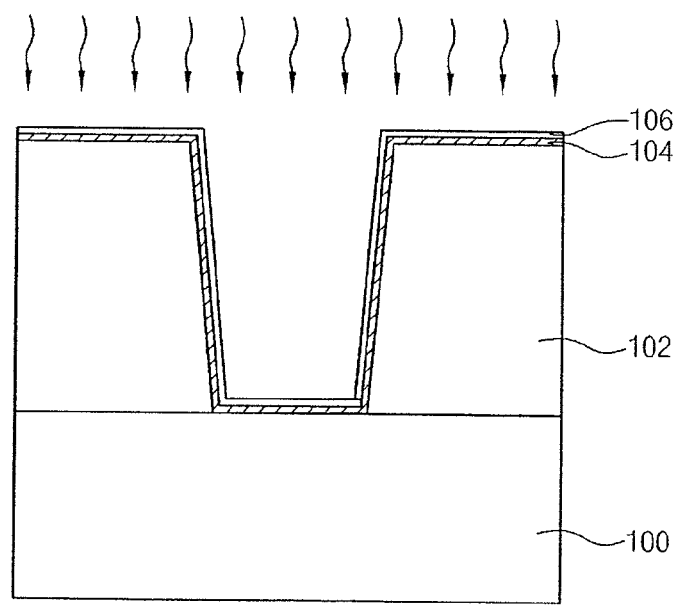

Referring to FIG. 2D, by oxidating the first Mo layer 106a, an $Mo_xO_y$ layer 106 is subsequently formed on the TaN layer 104. The oxidation of the first Mo layer 106a may be performed by any oxidation procedure in which it is preferable that the oxidation of the first Mo layer 106a is implemented using either a $O_2$ plasma process or a $O_2$ stuffing procedure.

The $O_2$ plasma process uses $O_2$ gas and Ar gas. The composition ratio of the $O_2$ gas and the Ar gas is preferable about 0.1~0.9. Also, the $O_2$ plasma processing is preferably conducted at a temperature of about 25~250° C. under a pressure of about 1~760 mTorr.

The $O_2$ stuffing procedure also uses $O_2$ gas and Ar gas. The composition ratio of the $O_2$ gas and the Ar gas also preferably about 0.1~0.9. Also, the $O_2$ stuffing procedure is preferably conducted at a temperature of about 50~400° C. under a pressure of about 1~760 mTorr.

The $Mo_xO_y$ layer 106, which is formed from the first Mo layer 106a, increases in volume and has a resultant thickness of preferably about 5~50 Å. The $Mo_xO_y$ layer 106 can comprise a stoichiometric or nonstoichiometric ratios. Preferably, the stoichiometric ratios of $Mo_xO_y$ layer 106 have an x subscript at a range of about 0.1~5 and y subscript at a range of about 0.1~5.

Figure 2E:
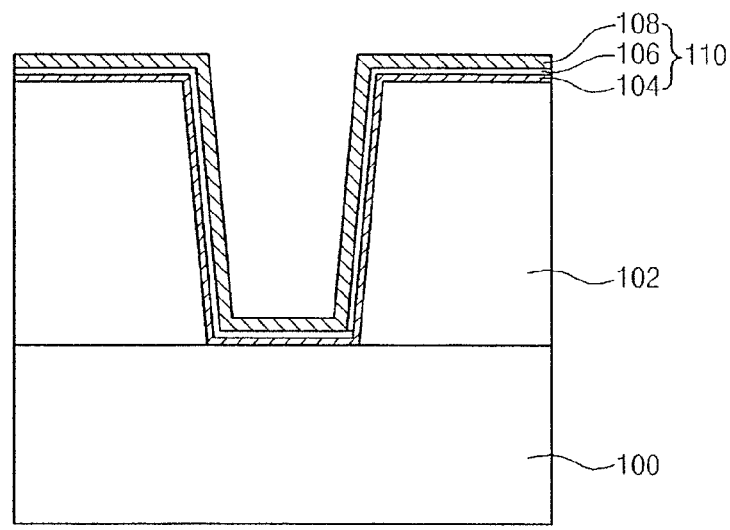

Referring now to FIG. 2E, a second Mo layer 108 is subsequently formed on the $Mo_xO_y$ layer 106. The second Mo layer 108 may be formed by using any Mo deposition technique in which it is preferable to use PVD as a deposition technique because PVD is less prone to introducing impurities and thus less prone to increasing in the resultant resistance. The second Mo layer 108 may be formed at any temperature in which it is preferable to form the second Mo layer 108 at a temperature of about −25~25° C. The second Mo layer 108 may be formed at any thickness in which it is preferable to have a thickness of about 100~400 Å. As a consequence of forming the TaN layer 104, the $Mo_xO_y$ layer 106 and the second Mo layer 108, a multi-layered diffusion barrier 110 is formed on the insulation layer 102 and on the surface of the metal line forming region D.

Figure 2F:
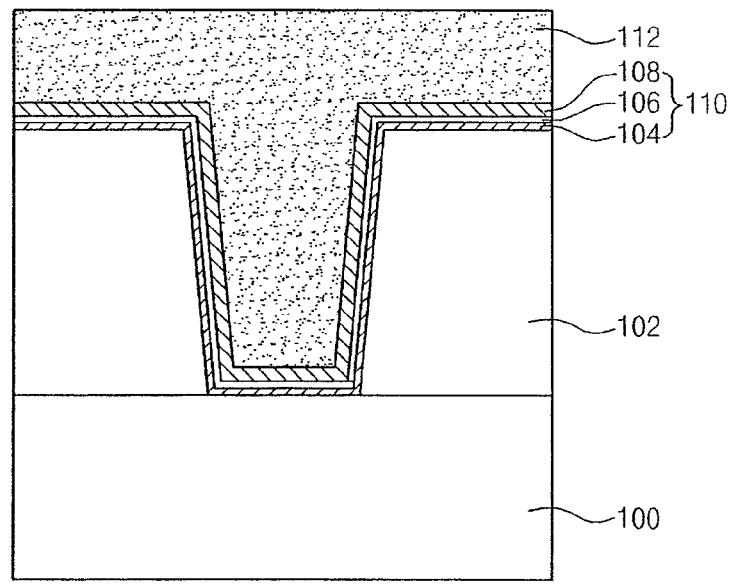

Referring now to FIG. 2F, a metal layer is subsequently formed on the diffusion barrier 110 which substantially fills in the metal line forming region D. The metal layer can be formed in any manner such as electroplating and can be formed of any conductive material or metal such as be formed as a copper layer 112.

Figure 2G:
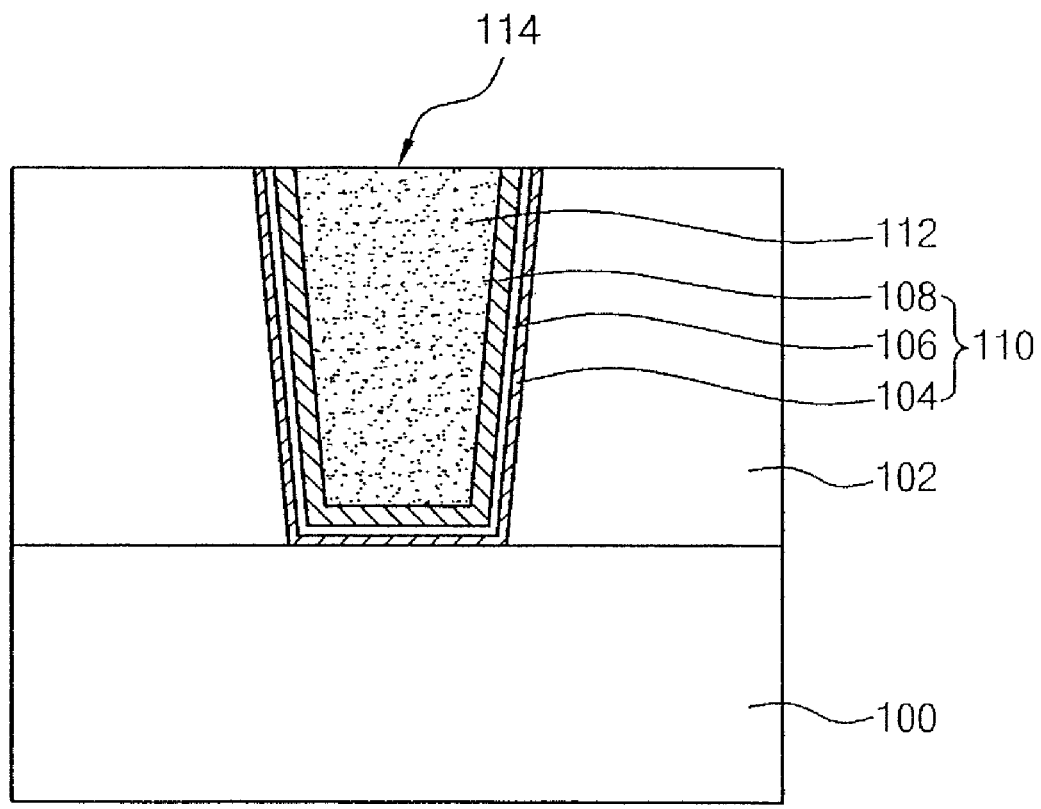

Referring now to FIG. 2G, by CMPing the copper layer 112 and the diffusion barrier 110 until the insulation layer 102 is exposed, a metal line 114 which can be subsequently formed that substantially fills in the metal line forming region D.

Thereafter, while not shown in a drawing, by sequentially conducting a series of other well-known subsequent processes, the formation of the metal line of a semiconductor device according to the embodiment of the present invention is completed.

As is apparent from the above description, in the present invention, a diffusion barrier, which includes a multi-layered structure of a TaN layer, an $Mo_xO_y$ layer and a second Mo layer, is formed between a copper layer and an insulation layer. Due to this fact, the physical property characteristics of the diffusion barrier can be effectively improved by having the second Mo layer which has low solid solubility with respect to other metal elements and by having the $Mo_xO_y$ layer which is formed through oxidation of a first Mo layer so as to increase a density at the peripheral portions of grains serving as diffusion paths. Therefore, in the present invention, as the characteristics of the diffusion barrier are improved, it is possible to prevent or at least minimize the occurrence of copper from diffusing through the diffusion barrier and adversely affecting the performance of the resultant semiconductor device. Thereby the present invention provides improved and desirable performance characteristics of the resultant metal line of a semiconductor device.

Further, in the present invention, since the diffusion barrier is formed having the multi-layered structure which includes the $Mo_xO_y$ layer and the second Mo layer, the physical and performance characteristics of the diffusion barrier can be improved to while at the same time the present invention makes it is possible to decrease the thickness of the TaN layer to half that as compared to the conventional arts. By doing this, in the present invention, the characteristics and the reliability of the resultant semiconductor device can be improved.

Moreover, in the present invention, when forming the multi-layered diffusion barrier of the TaN layer, the $Mo_xO_y$ layer and the second Mo layer, since the second Mo layer which has low resistance comes into contact with the copper layer, the second Mo layer can serve not only as the diffusion barrier but also as the seed layer of the copper layer. Accordingly, in the present invention, because the copper layer can be deposited without a copper seed layer, it is possible to prevent or at least minimize voids from being created in the metal line due to the overhang phenomenon of the copper seed layer.

In addition, in the present invention, when forming the multi-layered diffusion barrier having the TaN layer, the $Mo_xO_y$ layer and the second Mo layer, because the TaN layer comes into contact with the insulation layer, the junction capability between the TaN layer and the insulation layer can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for forming a electrical conductor line of a semiconductor device, comprising the steps of:
   forming a metal line forming region in an insulation layer on a semiconductor substrate;
   forming a multi-layered diffusion barrier on the metal line forming region of the insulation layer, the diffusion barrier comprising a TaN layer, an $Mo_xO_y$ layer and a second Mo layer, wherein the step of forming the diffusion barrier comprises the steps of:
      forming the TaN layer on the metal line forming region of the insulation layer;
      depositing a first Mo layer on the TaN layer;
      forming an $Mo_xO_y$ layer by oxidating the first Mo layer; and
      depositing the second Mo layer on the $Mo_xO_y$ layer wherein the diffusion barrier is multi-layered having the TaN layer, the $Mo_xO_y$ layer and the second Mo layer; and
   forming a metal line on the diffusion barrier to substantially fill in the metal line forming region.

2. The method according to claim 1, wherein the TaN layer has a thickness of about 5~50 Å.

3. The method according to claim 1, wherein the first Mo layer has a thickness of about 5~25 Å.

4. The method according to claim 1, wherein the step of forming the $Mo_xO_y$ layer by oxidating the first Mo layer is implemented by utilizing a $O_2$ plasma process or by utilizing $O_2$ stuffing procedure.

5. The method according to claim 4, wherein the $O_2$ plasma process uses $O_2$ gas and Ar gas with a composition ratio of $O_2$ gas to Ar gas at about 0.1~0.9.

6. The method according to claim 4, wherein the $O_2$ plasma is process is conducted at a temperature of about 25~250° C. at a pressure of about 1~760 mTorr.

7. The method according to claim 4, wherein the $O_2$ stuffing procedure uses $O_2$ gas and Ar gas at a composition ratio of $O_2$ gas to Ar gas at about 0.1~0.9.

8. The method according to claim 4, wherein the $O_2$ stuffing procedure is conducted at a temperature of about 50~400° C. at a pressure of about 1~760 mTorr.

9. The method according to claim 1, wherein the $Mo_xO_y$ layer has a thickness of about 5~50 Å.

10. The method according to claim 1, wherein, in the $Mo_xO_y$ layer, x has a range of about 0.1~5 and y has a range of about 0.1~5.

11. The method according to claim 1, wherein the second In Mo layer is deposited through Physical Vapor Deposition (PVD).

12. The method according to claim 1, wherein the second Mo layer is deposited at a temperature of between about −25~25° C.

13. The method according to claim 1, wherein the second Mo layer has a thickness of between about 100~400 Å.

14. The method according to claim 1, wherein the metal layer comprises a copper layer.

* * * * *